(12) United States Patent
Lo et al.

(10) Patent No.: US 11,018,259 B2
(45) Date of Patent: May 25, 2021

(54) SEMICONDUCTOR DEVICE COMPRISING GATE STRUCTURE AND DOPED GATE SPACER

(71) Applicant: TAIWAN SEMICONDUCTOR MANUFACTURING CO., LTD., Hsinchu (TW)

(72) Inventors: Wei-Yang Lo, Kaohsiung (TW); Tung-Wen Cheng, New Taipei (TW); Chia-Ling Chan, New Taipei (TW); Mu-Tsang Lin, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

(21) Appl. No.: 15/161,139

(22) Filed: May 20, 2016

(65) Prior Publication Data
US 2017/0179290 A1 Jun. 22, 2017

Related U.S. Application Data

(60) Provisional application No. 62/269,012, filed on Dec. 17, 2015.

(51) Int. Cl.
*H01L 29/78* (2006.01)
*H01L 29/66* (2006.01)
*H01L 21/223* (2006.01)

(52) U.S. Cl.
CPC ...... *H01L 29/7851* (2013.01); *H01L 21/2236* (2013.01); *H01L 29/6659* (2013.01);
(Continued)

(58) Field of Classification Search
CPC .......... H01L 29/7851; H01L 29/66795; H01L 29/7833; H01L 21/2236; H01L 29/66492; H01L 21/2254; H01L 21/2256; H01L 21/2257; H01L 29/785; H01L 29/66803; H01L 29/6659; H01L 29/66545; H01L 21/823468; H01L 29/423
See application file for complete search history.

(56) References Cited

U.S. PATENT DOCUMENTS 5,847,428 A * 12/1998 Fulford, Jr. ........... H01L 29/665
257/344
6,087,210 A * 7/2000 Sohn ................ H01L 21/823807
257/E21.345

(Continued)

FOREIGN PATENT DOCUMENTS

| CN | 102194756 A | 9/2011 |
| CN | 103972290 A | 8/2014 |

(Continued)

*Primary Examiner* — Nilufa Rahim
*Assistant Examiner* — Scott E Bauman
(74) *Attorney, Agent, or Firm* — Cooper Legal Group, LLC

(57) ABSTRACT

A semiconductor device includes a substrate, at least one source drain feature, a gate structure, and at least one gate spacer. The source/drain feature is present at least partially in the substrate. The gate structure is present on the substrate. The gate spacer is present on at least one sidewall of the gate structure. At least a bottom portion of the gate spacer has a plurality of dopants therein.

20 Claims, 7 Drawing Sheets

(52) U.S. Cl.
CPC .. *H01L 29/66492* (2013.01); *H01L 29/66545* (2013.01); *H01L 29/66795* (2013.01); *H01L 29/66803* (2013.01); *H01L 29/7833* (2013.01)

(56) References Cited

U.S. PATENT DOCUMENTS

| | | | |
|---|---|---|---|
| 9,490,332 B1 * | 11/2016 | Balakrishnan | H01L 29/66545 |
| 10,879,399 B2 * | 12/2020 | Lo | H01L 29/66803 |
| 2002/0105066 A1 * | 8/2002 | Eikyu | H01L 21/2658 257/685 |
| 2002/0123180 A1 * | 9/2002 | Rabkin | H01L 21/823468 438/197 |
| 2006/0223264 A1 * | 10/2006 | Park | H01L 27/105 438/266 |
| 2007/0131986 A1 | 6/2007 | Hwang | |
| 2008/0272445 A1 * | 11/2008 | Dyer | H01L 29/4983 257/412 |
| 2008/0311732 A1 * | 12/2008 | Dokumaci | H01L 21/2254 438/525 |
| 2009/0017625 A1 * | 1/2009 | Lee | H01L 21/31144 438/694 |
| 2014/0217483 A1 * | 8/2014 | Choi | H01L 29/785 257/288 |
| 2014/0264575 A1 * | 9/2014 | Tsai | H01L 29/66492 257/336 |
| 2015/0069466 A1 | 3/2015 | Chang et al. | |
| 2017/0069737 A1 * | 3/2017 | Choi | H01L 29/785 |

FOREIGN PATENT DOCUMENTS

| | | | | |
|---|---|---|---|---|
| KR | 1019990051219 A | | 5/1999 | |
| KR | 1020140099727 A | | 8/2014 | |
| KR | 1020150029502 A | | 3/2015 | |
| KR | 20170028005 A | * | 3/2017 | ......... H01L 29/0847 |
| TW | 201436052 A | | 9/2014 | |
| TW | 201532128 A | | 8/2015 | |
| TW | 201535531 A | | 9/2015 | |

* cited by examiner

SEMICONDUCTOR DEVICE COMPRISING GATE STRUCTURE AND DOPED GATE SPACER

PRIORITY CLAIM AND CROSS-REFERENCE

This application claims priority to U.S. Provisional Application Ser. No. 62/269,012, filed Dec. 17, 2015, which is herein incorporated by reference.

BACKGROUND

With the increasing down-scaling of integrated circuits and increasingly demanding want for the speed of integrated circuits, transistors have higher drive currents with smaller dimensions. Fin Field-Effect Transistors (FinFET) were thus developed. FinFET transistors have increased channel widths. The increase in the channel widths is achieved by forming channels that include portions on the sidewalls of the fins and portions on the top surfaces of the fins. Since the drive currents of transistors are proportional to the channel widths, the drive currents of FinFETs are increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
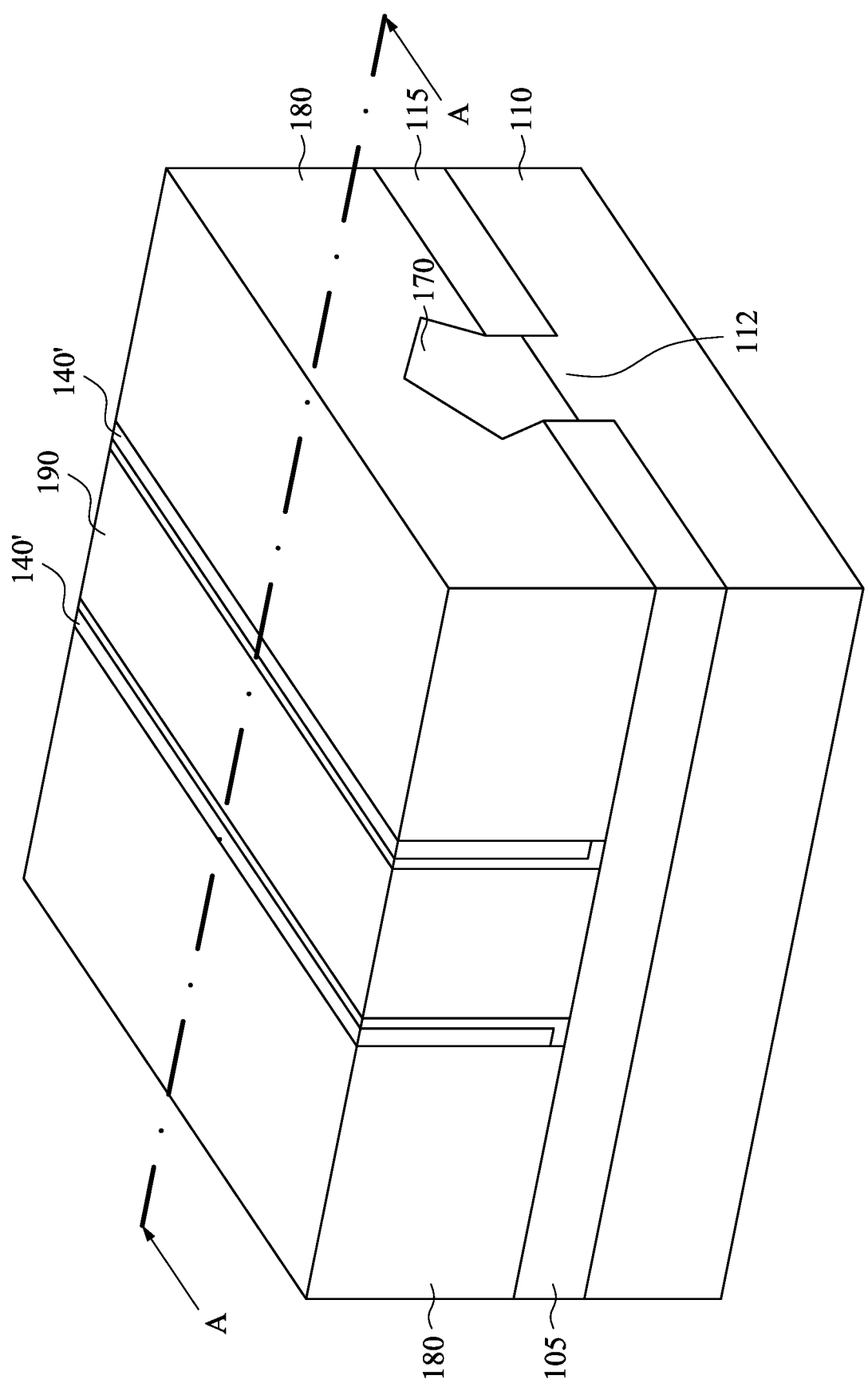
FIG. 1 is a schematic diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

Figure 2:
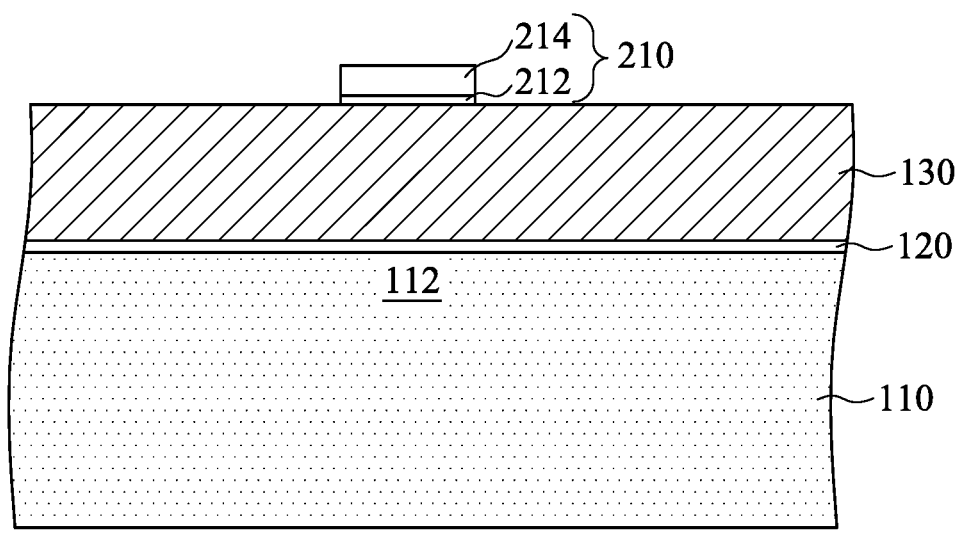
FIGS. 2 to 11 are cross-sectional views of a method for manufacturing the semiconductor device of FIG. 1 at various stages in accordance with some embodiments of the present disclosure.

FIG. 1 is a schematic diagram of a semiconductor device in accordance with some embodiments of the present disclosure, and FIGS. 2 to 11 are cross-sectional views of a method for manufacturing the semiconductor device of FIG. 1 at various stages in accordance with some embodiments of the present disclosure. The cross-section positions of FIGS. 2 to 11 take along line A-A of FIG. 1. Reference is made to FIG. 2. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

At least one semiconductor fin 112 is formed on the substrate 110. In some embodiments, the semiconductor fin 112 includes silicon. The semiconductor fin 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fin 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Reference is made to FIG. 1. A plurality of isolation structures 105 can be formed on the substrate 110. The isolation structures 105, which act as a shallow trench isolation (STI) around the semiconductor fin 112, may be formed by chemical vapor deposition (CVD) techniques using tetra-ethyl-ortho-silicate (TEOS) and oxygen as a precursor. In some other embodiments, the isolation structures 105 may be formed by implanting ions, such as oxygen, nitrogen, carbon, or the like, into the substrate 110. In yet some other embodiments, the isolation structures 105 are insulator layers of a SOI wafer.

Reference is made to FIG. 2. A gate dielectric 120 is formed to cover the semiconductor fins 112. The gate dielectric 120 may be formed by thermal oxidation, chemical vapor deposition, sputtering, or other methods known and used in the art for forming a gate dielectric. Depending on the technique of dielectric layer formation, the thickness of the gate dielectric 120 on the top of the semiconductor fins 112 may be different from the thickness of the gate dielectric 120 on the sidewall (not shown) of the semiconductor fins 112. The gate dielectric 120 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate dielectric 120 may have a multilayer structure such as one layer of silicon oxide (e.g., interfacial layer) and another layer of high-k material.

A dummy layer 130 is formed on the gate dielectric 130. The dummy layer 130 may be deposited by chemical vapor deposition (CVD), by sputter deposition, or by other techniques known and used in the art for depositing conductive materials. The dummy layer 130 may include polycrystalline-silicon (poly-Si) or poly-crystalline silicon-germanium (poly-SiGe). For example, in some embodiments, the dummy layer 130 includes polysilicon deposited undoped by low-pressure chemical vapor deposition (LPCVD). The polysilicon may also be deposited, for example, by furnace deposition of an in-situ doped polysilicon. Alternatively, the dummy layer 130 may includes other suitable materials. Further, the dummy layer 130 may be doped poly-silicon with uniform or non-uniform doping.

A mask layer 210 is formed on the dummy layer 130 by suitable process(es) to a suitable thickness. The mask layer 210 covers a portion of the dummy layer 130 while leaves other portions of the dummy layer 130 uncovered. The mask layer 210, in some embodiments, is a hard mask layer which includes silicon oxide. The mask layer 210, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 100 Angstroms to about 500 Angstroms. In some other embodiments, the mask layer 210 may be a photo-resist layer. The photo-resist layer is deposited on the dummy layer 130, for example, by spin coating, and is used to form an intended pattern by way of irradiating, developing, drying, etching, and other suitable processes. In some embodiments, the mask layer 210 includes a silicon nitride layer 212 disposed on the dummy layer 130 and an oxide layer 214 disposed on the silicon nitride layer 212.

Figure 3:
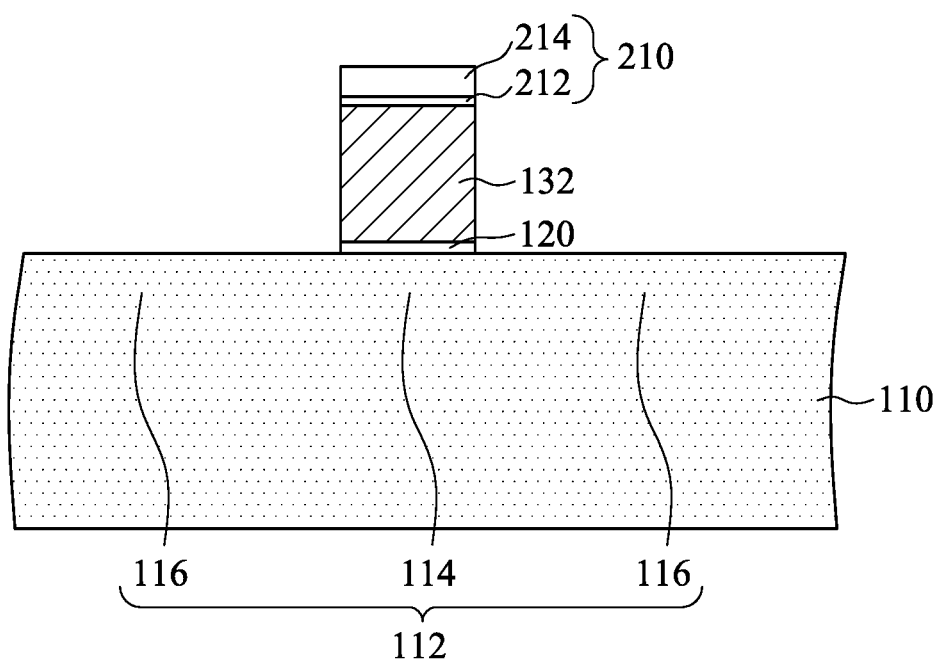

Reference is made to FIG. 3. A removing (or etch) process is performed to remove portions other than the intended pattern of the dummy layer 130 (see FIG. 1) (i.e., the portions uncovered by the mask layer 210) to form a dummy gate 132. In some embodiments, such an etch process may be performed multiple times. However, the patterning process is not limited to a photolithography process using photo-resists, and may be performed by an immersion lithography, electron beam lithography, or other suitable processes. As a result, the pattern of the dummy gate 132 as shown in FIG. 3 is obtained. At least a portion of the semiconductor fin 112 covered by the dummy gate 132 is referred as a channel portion 114 of the semiconductor fin 112, and other portions of the semiconductor fin 112 uncovered by the dummy gate 132 is referred as uncovered portions 116. In some embodiments, the gate dielectric 120 is also patterned, such that the semiconductor fin 112 have portions that are uncovered by the gate dielectric 120 and the dummy gate 132 (as shown in FIG. 3). In some other embodiments, the semiconductor fin 112 may be capped with the gate dielectric 120.

Figure 4:
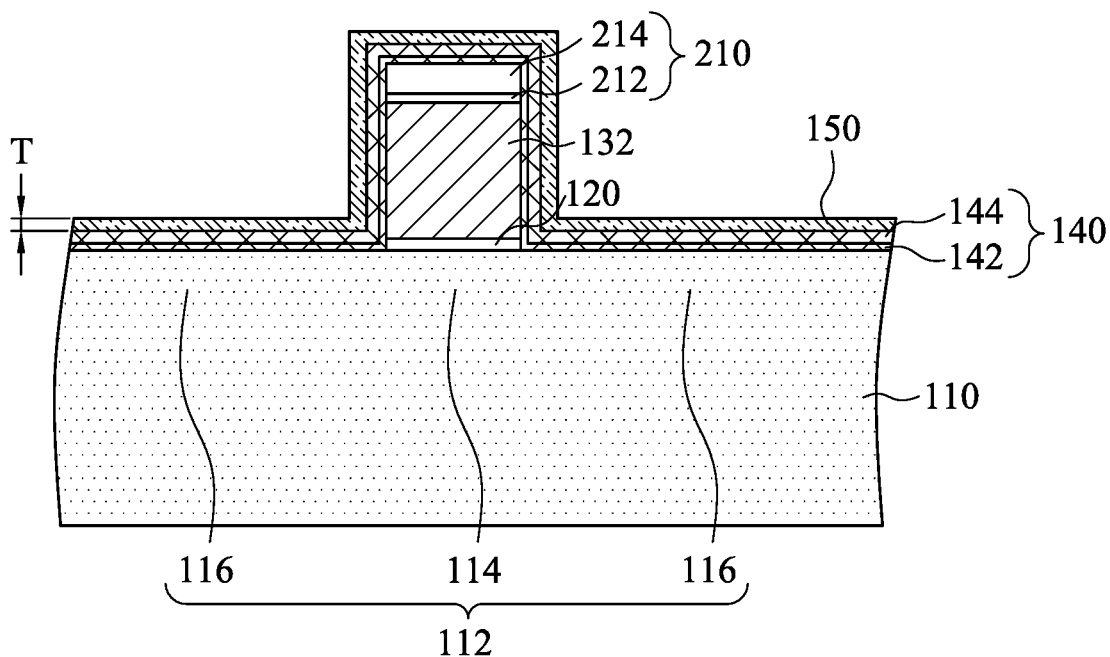

Reference is made to FIG. 4. A spacer layer 140 is formed to cover the dummy gate 132, the mask layer 210, and the semiconductor fin 112. In some embodiments, the spacer layer 140 is a composite layer including a lower sub layer 142 and an upper sub layer 144, which may have different etching characteristics. In some embodiments, the lower sub layer 142 is formed of oxides, thus is interchangeably referred to as a liner oxide layer, and the upper sub layer 144 is formed of silicon nitride or silicon oxynitride, thus is referred to as a nitride layer. In some other embodiments, the spacer layer 140 may have a single or a composite layer including oxide, silicon nitride, silicon oxynitride (SiON) and/or other dielectric materials. The spacer layer 140 may be formed using plasma enhanced chemical vapor deposition (PECVD), low-pressure chemical vapor deposition (LPCVD), sub-atmospheric chemical vapor deposition (SACVD), etc.

The spacer layer 140 is then doped. In some embodiments, the spacer layer 140 can be doped by performing a plasma deposition (PLAD) process. In greater detail, a dopant-rich layer 150 is formed on the spacer layer 140. The dopant-rich layer 150 may be formed by, for example, plasma ion assisted deposition (PIAD). The dopant-rich layer 150 includes the impurity that is used for forming dopants in the spacer layer 140. The dopant-rich layer 150 may be formed of an n-type impurity (impurities) or a p-type impurity (impurities). For example, dopant-rich layer 150 may include boron (such $BF_2$ or $B_2H_6$), indium, phosphorous and/or arsenic. In some embodiments, the thickness T of the dopant-rich layer 150 is about 5 nm to about 6 nm.

Figure 5:
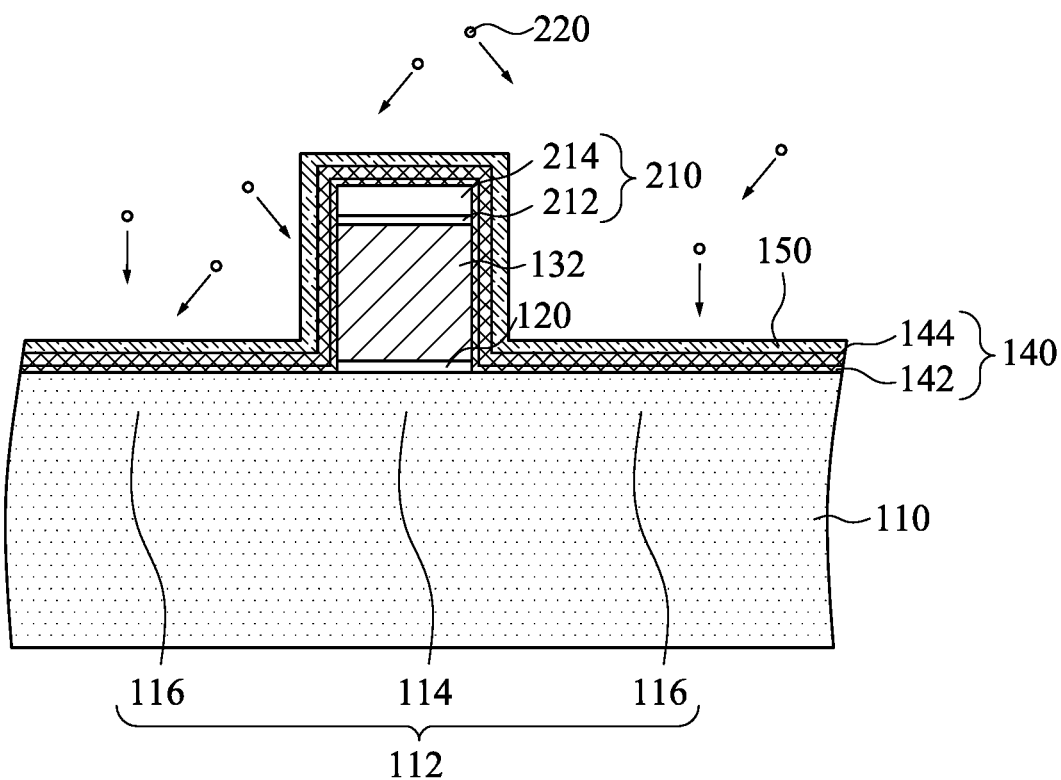

Reference is made to FIG. 5. A knock-on implantation is performed to knock the impurity in the dopant-rich layer 150 into the spacer layer 140. The ions 220 used in the knock-on implantation may include group VIIIA or inert gas ions, such as Xe, Ar, Ne, He, Kr, or combinations thereof, or other ions that do not adversely affect the characteristics of the resulting fin field effect transistor (FinFET). In some embodiments, the knock-on implantation is induced by the scattering of the inert gas ions. In some embodiments, the PIAD and the knock-on implantation can be considered a plasma doping (PLAD) process in deposition and ion modes. Since the PLAD process is induced by the scattering of the inert gas ions, the PLAD process is an isotropically doping process. That is, the portions of the spacer layer 140 on the sidewall of the dummy gate 132 can be doped. Therefore, the spacer layers 140 include group VIIIA impurities. In some embodiments, at least one annealing process can be performed to the doped spacer layer 140 to diffuse the dopants therein. In some embodiments, when the dopants are arsenic, the arsenic dopant concentration of the spacer layer 140 is in a range from about $6\times10^{19}$ atoms/cm$^3$ to about $1\times10^{21}$ atoms/cm$^3$; when the dopants are phosphorous, the phosphorous dopant concentration of the spacer layer 140 is in a range from about $2\times10^{19}$ atoms/cm$^3$ to about $3\times10^{20}$ atoms/cm$^3$; when the dopants are boron, the boron dopant concentration of the spacer layer 140 is in a range from about $1\times10^{20}$ atoms/cm$^3$ to about $1\times10^{21}$ atoms/cm$^3$. In some embodiments, when the inert gas ions are Xe, the Xe concentration of the spacer layer 140 is in a range from about $2\times10^{18}$ atoms/cm$^3$ to about $5\times10^{18}$ atoms/cm$^3$.

Figure 6:
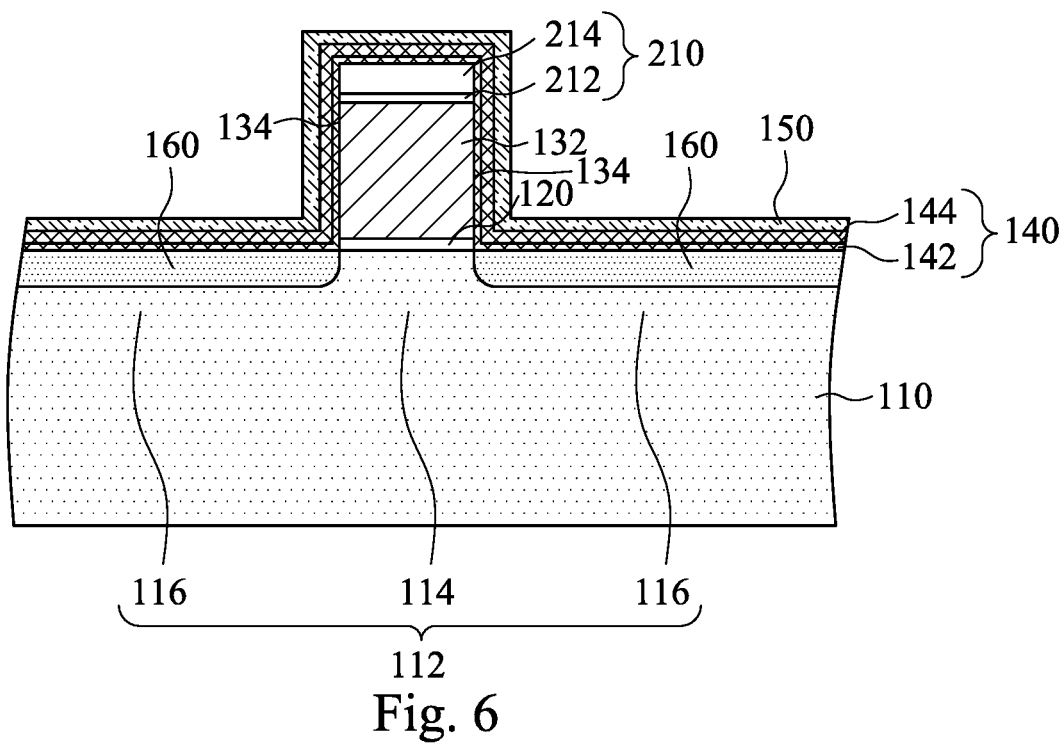

Reference is made to FIG. 6. A plurality of light-doped drain (LDD) regions 160 are formed in the semiconductor fin 112. More specifically, the LDD regions 160 are formed in the uncovered portion 116 of the semiconductor fin 112. The two LDD regions 160 are interposed by the dummy gate 132. That is, the LDD regions 160 are substantially aligned with the sidewall 134 of the dummy gate 132. The LDD regions 160 can be formed by a PLAD process, an ion implantation process, diffusion process, and/or other suitable processes. In some embodiments, the doping of the spacer layer 140 and the formation of the LDD regions 160 can be performed together if the LDD regions 160 are formed by performing the PLAD process. That is, the spacer layer 140 and the LDD regions 160 have substantially the same dopants. However, in some other embodiments, the doping of the spacer layer 140 and the formation of the LDD regions 160 can be separately performed. Depending on the conductivity type of the resulting FinFET, the LDD regions 160 may be doped with n-type dopants or p-type dopants. For example, if the resulting FinFET is an n-type FinFET, the dopants in the LDD regions 160 may be phosphorous, arsenic, or combinations thereof, while if the resulting FinFET is a p-type FinFET, the dopants in the LDD regions 160 may be boron, indium, or combinations thereof.

Figure 7:
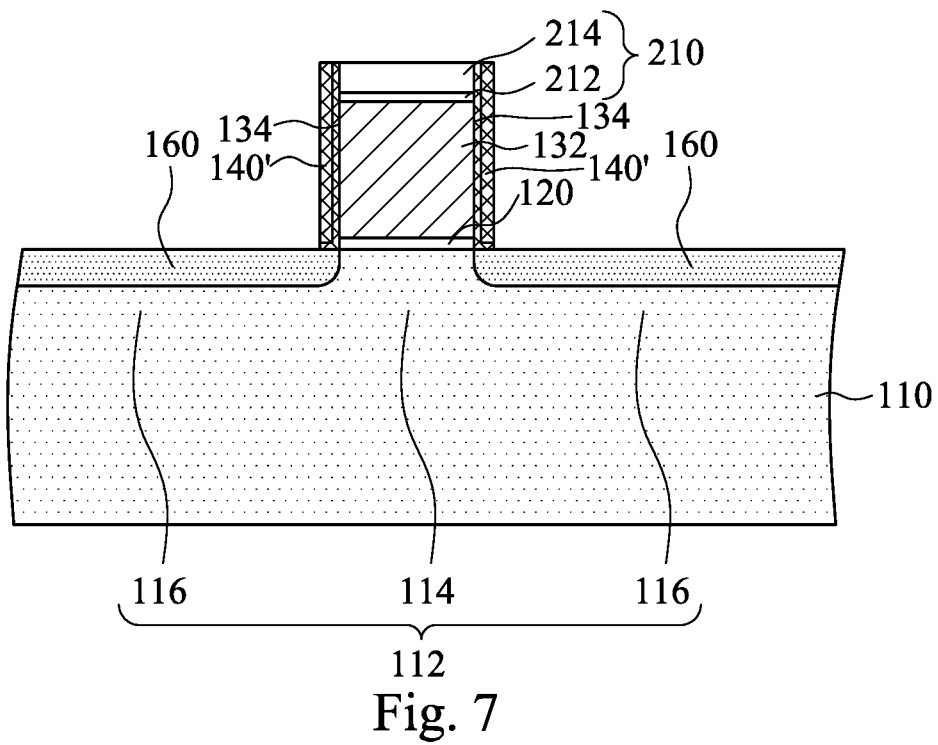

Reference is made to FIG. 7. The spacer layer 140 is patterned to be a pair of gate spacers 140' present on opposite sidewalls 134 of the dummy gate 132 and on opposite sidewalls of the mask layer 210. Either wet etching or dry etching may be used for the patterning. The gate spacer 140' includes a liner oxide portion (also referred to as an inner portion) and a nitride portion (also referred to as an outer portion).

Figure 8:
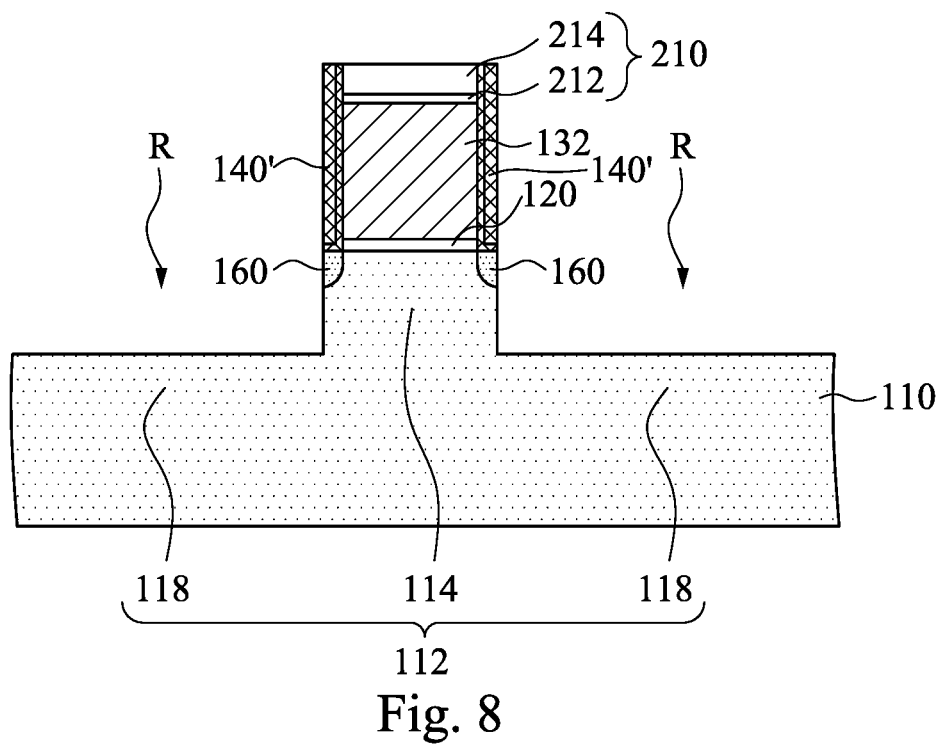

Reference is made to FIG. 8. Portions of the semiconductor fin 112 exposed both by the dummy gate 132 and the gate spacers 140' are removed (or recessed) to form at least one recess R in the semiconductor fin 112. For example, there are two of the recesses R in FIG. 8. Any suitable amount of material may be removed. In some embodiments, portions of the LDD regions 160 are removed as well, and the remaining LDD regions 160 are adjacent to the recesses R and the gate spacers 140'. The remaining semiconductor fin 112 has recessed portions 118 and the channel portion 114. The recessed portions 118 are embedded in the substrate 110 and portions thereof are exposed by the recesses R. The channel portion 114 is present under the dummy gate 132 and is the channel of the FinFET. The LDD regions 160 are present in the channel portions 114 and under the gate spacers 140'.

Removing portions of the semiconductor fin 112 may include forming a photoresist layer or a capping layer (such as an oxide capping layer) over the structure of FIG. 7, patterning the photoresist or the capping layer to have openings that expose a portion of the semiconductor fin 112, and etching back material from the semiconductor fin 112. In some embodiments, the semiconductor fin 112 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses R with HF or other suitable solution.

Figure 9:
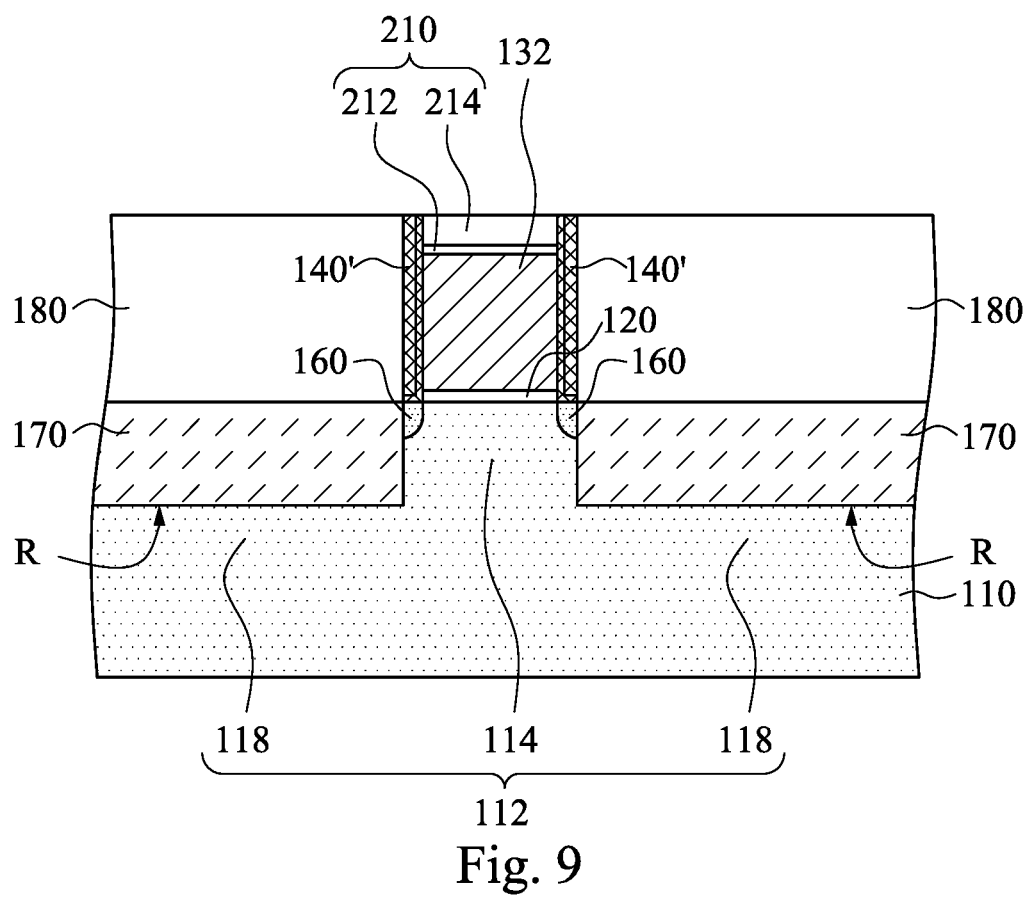

Reference is made to FIG. 9. A plurality of epitaxy structures 170 are respectively formed in the recesses R and on the recessed portions 118 of the semiconductor fin 112. The epitaxy structures 170 and the recessed portions 118 form source drain portions of the semiconductor fin 112. The epitaxy structures 170 may be formed using one or more epitaxy or epitaxial (epi) processes, such that Si features, SiGe features, and/or other suitable features can be formed in a crystalline state on the recessed portions 118 of the semiconductor fin 112. In some embodiments, the lattice constant of the epitaxy structures 170 are different from the lattice constant of the semiconductor fin 112, and the epitaxy structures 170 are strained or stressed to enable carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the recessed portions 118 of the semiconductor fin 112 (e.g., silicon). Thus, a strained channel can be achieved to increase carrier mobility and enhance device performance. The epitaxy structures 170 may be in-situ doped. The doping species include p-type dopants, such as boron or $BF_2$; n-type dopants, such as phosphorus or arsenic; and/or other suitable dopants including combinations thereof. If the epitaxy structures 170 are not in-situ doped, a second implantation process (i.e., a junction implant process) is performed to dope the epitaxy structures 170. One or more annealing processes may be performed to activate the epitaxy structures 170. The annealing processes include rapid thermal annealing (RTA) and/or laser annealing processes.

In some embodiments, a plurality of silicide contacts (not shown) respectively present on the epitaxy structures 170. Silicides, which are compounds formed from a metal and silicon, are used for contacts in semiconductor devices. Silicide contacts are thermally stable, have lower resistivity than polysilicon, and are good ohmic contacts. Silicide contacts are also reliable, since the silicidation reaction eliminates many defects at an interface between a contact and a device feature. A technique used in the semiconductor manufacturing industry is self-aligned silicide ("salicide") processing. Silicide processing can be used in the fabrication of high-speed complementary metal oxide semiconductor (CMOS) devices. The silicide process converts the surface portions of the epitaxy structures 170 into the silicide contacts. Silicide processing involves the deposition of a metal that undergoes a silicidation reaction with silicon (Si). In order to form silicide contacts on the epitaxy structures 170, metal material is blanket deposited on the epitaxy structures 170. After heating the wafer to a temperature at which the metal reacts with the silicon of the epitaxy structures 170 to form contacts, unreacted metal is removed. Silicide contacts remain over the epitaxy structures 170, while unreacted metal is removed from other areas.

Then, a dielectric layer 180 is formed at outer sides of the gate spacers 140' and on the substrate 110. That is, the dielectric layer 180 surrounds the gate spacers 140' and the dummy gate 132. The dielectric layer 180 includes silicon oxide, oxynitride or other suitable materials. The dielectric layer 180 includes a single layer or multiple layers. The dielectric layer 180 is formed by a suitable technique, such as CVD or ALD. A chemical mechanical planarization (CMP) process may be applied to remove excessive dielectric layer 180 and expose the top surface of the dummy gate 132 to a subsequent dummy gate removing process.

Figure 10:
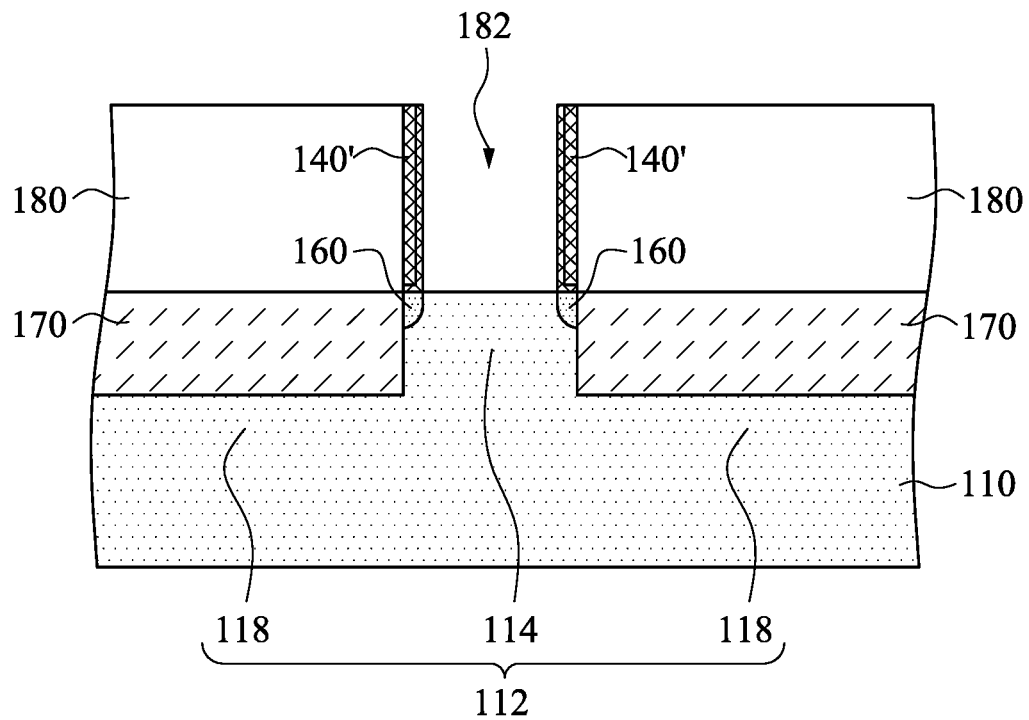

Reference is made to FIG. 10. The dummy gate 132 (see FIG. 9) is removed to form an opening 182 with the gate spacers 140' as its sidewall. In some other embodiments, the gate dielectric 120 of FIG. 9 is removed as well. Alternatively, in some embodiments, the dummy gate 132 is removed while the gate dielectric 120 retains. The dummy gate 132 (and the gate dielectric 120) may be removed by dry etch, wet etch, or a combination of dry and wet etch. For example, a wet etch process may include exposure to a hydroxide containing solution (e.g., ammonium hydroxide), deionized water, and/or other suitable etchant solutions.

In FIG. 10, since the gate spacers 140' are doped, the etching rate of the gate spacers 140' is lower than an undoped gate spacer. Therefore, when the dummy gate 132 is removed, the gate spacers 140' is not easy to be removed. With such configuration, a gate structure 190 (see FIG. 11) formed in the opening 182 is not connected to the source drain features (such as the semiconductor fin 112 and/or the epitaxy structures 170). The gate spacers 140' can be a good isolation therebetween.

Figure 11:
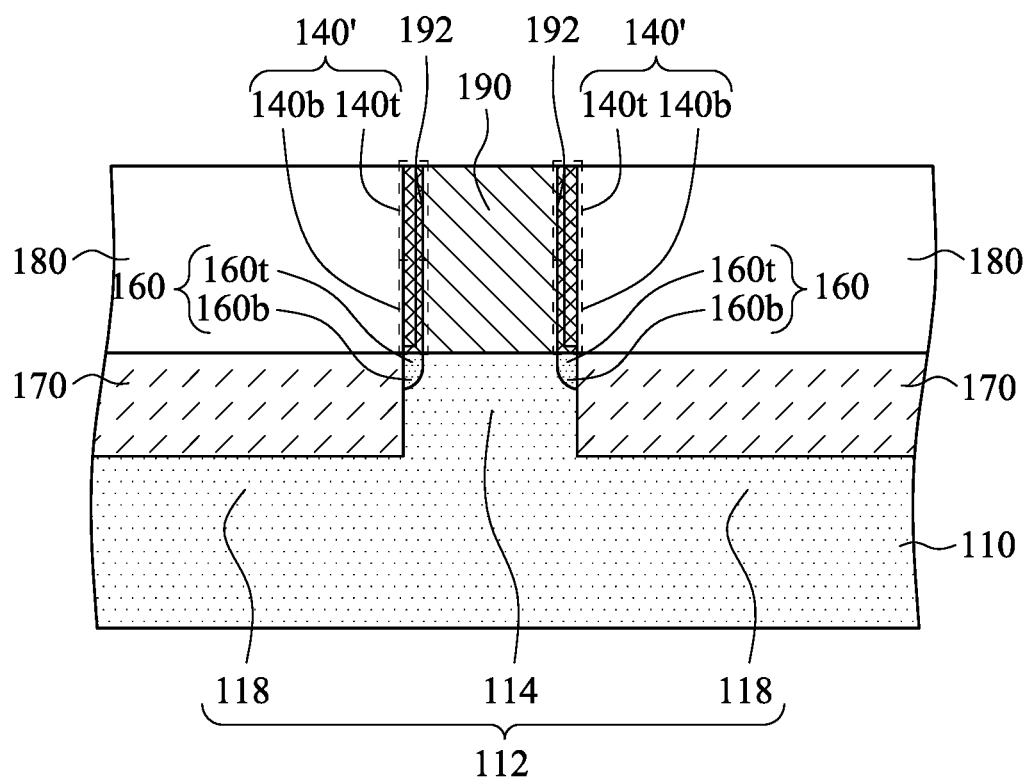

Reference is made to FIG. 11. A gate structure 190 is formed in the opening 182. In other words, the gate spacers 140' are disposed on opposite sidewalls 192 of the gate structure 190. The gate structure 190 formed may also include gate dielectric layer(s), capping layer(s), fill layer(s), and/or other suitable layers that are desirable in a metal gate stack. A work function metal layer included in the gate structure 190 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In some embodiments, the gate structure 190 formed is a p-type metal gate including a p-type work function layer. In some embodiments, the capping layer included in the gate structure 190 may include refractory metals and their nitrides (e.g. TiN, TaN, $W_2N$, TiSiN, TaSiN). The cap layer may be deposited by PVD, CVD, Metal-organic chemical vapor deposition (MOCVD) and ALD. In some embodiments, the fill layer included in the gate structure 180 may includes tungsten (W). The metal layer may be deposited by ALD, PVD, CVD, or other suitable process. After the formation of the gate structure 190, the semiconductor device is shown as FIG. 1.

Reference is made to FIGS. 1 and 11. In the structural point of view, the gate spacer 140' have a top portion 140t and a bottom portion 140b. The bottom portion 140b is present between the top portion 140t and the semiconductor fin 112. In some embodiments, the bottom portion 140b of the gate spacer 140' is adjacent to the semiconductor fin 112. Since at least the bottom portions 140b of the gate spacers 140' are doped, and the dopant concentration of the bottom portions 140b of the gate spacers 140' is about $6 \times 10^{19}$ atoms/$cm^3$ to about $1 \times 10^{20}$ atoms/$cm^3$, the etching rate of the gate spacers 140' is lower than the etching rate of an undoped gate spacer. Therefore, the gate spacers 140' is not broken when the opening 182 is formed. With such configuration, the gate structure 190 formed in the opening 182 is not connected to the source drain features (such as the semiconductor fin 112 and/or the epitaxy structures 170). The gate spacers 140' can be a good isolation therebetween.

Reference is made to FIG. 11. The LDD region 160 of the semiconductor fin 112 has a top portion 160t and a bottom portion 160b. The top portion 160t is present between the bottom portion 160b and the gate spacer 140'. The dopant concentration of the top portion 160t can be about $2 \times 10^{20}$ atoms/$cm^3$ to about $3 \times 10^{20}$ atoms/$cm^3$, and the dopant concentration of the bottom portion 160b can be about $2 \times 10^{19}$ atoms/$cm^3$ to about $4 \times 10^{19}$ atoms/$cm^3$. That is, the dopant concentration of the bottom portion 140b of the gate spacer 140' is higher than the dopant concentration of the bottom portion 160b of the LDD region 160, and the dopant concentration of the bottom portion 140b of the gate spacer 140' is lower than the dopant concentration of the top portion 160t of the LDD region 160.

Figure 12:
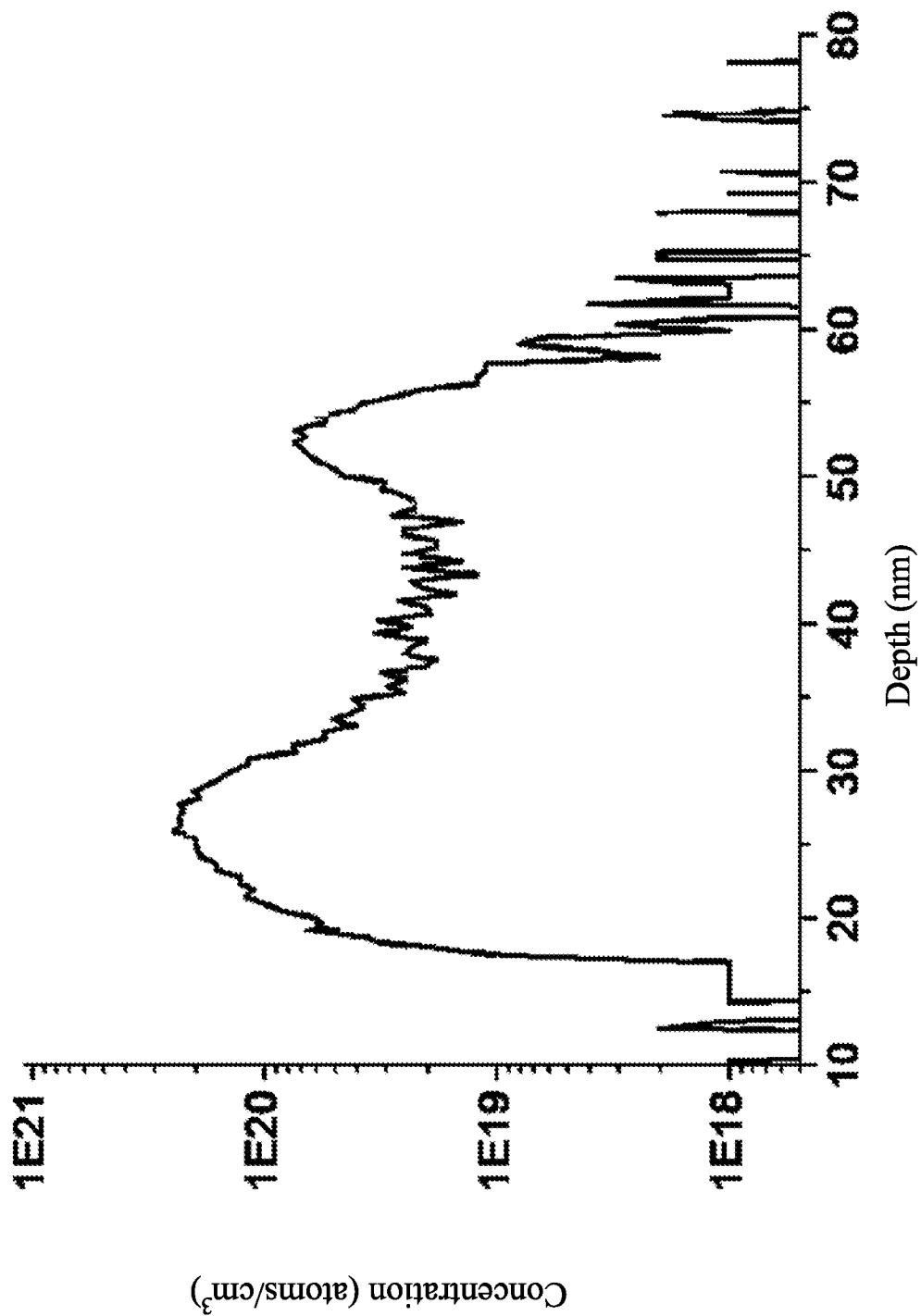
FIG. 12 is an arsenic concentration depth profile of a semiconductor device in accordance with one or more embodiments.

FIG. 12 is an arsenic concentration depth profile of a semiconductor device in accordance with one or more embodiments. The dopants of the gate spacer and the LDD regions were arsenic. The inert gas ions were Xe. The gate spacers were made of oxide and nitride. The top portion of the LDD region was around a depth of about 18 nm, and the bottom portion of the LDD region was around a depth of about 46 nm.

According to some embodiments, a semiconductor device includes a substrate, at least one source drain feature, a gate structure, and at least one gate spacer. The source/drain feature is present at least partially in the substrate. The gate structure is present on the substrate. The gate spacer is present on at least one sidewall of the gate structure. At least a bottom portion of the gate spacer has a plurality of dopants therein.

According to some embodiments, a semiconductor device includes a substrate, at least one semiconductor fin, a gate structure, and at least one gate spacer. The semiconductor fin is present on the substrate. The semiconductor fin includes at least one channel portion and at least one source drain portion. The gate structure is present on the channel portion of the semiconductor fin. The gate spacer is present adjacent to the gate structure, on the semiconductor fin, and between the channel portion and the source drain portion of the semiconductor fin. The gate spacer includes a plurality of group VIIIA impurities therein.

According to some embodiments, a method for manufacturing a semiconductor device includes forming a semiconductor fin on a substrate. A gate structure is formed on the semiconductor fin. A spacer layer is formed to cover the gate structure and the semiconductor fin. An isotropically doping process is performed to dope the spacer layer. The spacer layer is patterned to form at least one gate spacer on at least one sidewall of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
at least one source drain feature, wherein the source drain feature comprises:
an epitaxy structure over a first portion of a fin region of the substrate; and
a light-doped drain (LDD) region adjacent to the epitaxy structure, wherein a bottom surface of the epitaxy structure is below a bottom surface of the LDD region;
a gate structure over a second portion of the fin region;
at least one gate spacer present on at least one sidewall of the gate structure, wherein:
the gate spacer comprises a first layer and a second layer over the first layer,
the first layer comprises an oxide,
the second layer comprises a nitride,
at least a bottom portion of the second layer has a plurality of dopants therein,
an upper portion of the LDD region has a dopant concentration higher than a dopant concentration of a bottom portion of the gate spacer, and
a lower portion of the LDD region has a dopant concentration lower than the dopant concentration of the bottom portion of the gate spacer; and
a dielectric layer in contact with a portion of the first layer underlying the second layer and in contact with the second layer.

2. The semiconductor device of claim 1, wherein the dopant concentration of the bottom portion of the gate spacer is in a range from about $6 \times 10^{19}$ atoms/cm$^3$ to about $1 \times 10^{20}$ atoms/cm$^3$.

3. The semiconductor device of claim 1, wherein the epitaxy structure is in contact with a sidewall of the second portion of the fin region.

4. The semiconductor device of claim 1, wherein the bottom portion of the gate spacer is adjacent to the source drain feature.

5. The semiconductor device of claim 1, wherein an outermost sidewall of the LDD region is adjacent to the epitaxy structure and is co-planar with a sidewall of the first layer and a sidewall of the second layer.

6. The semiconductor device of claim 1, wherein the gate spacer comprises a plurality of group VIIIA impurities.

7. A semiconductor device comprising:
a substrate;
at least one source drain feature, wherein the source drain feature comprises an epitaxy structure over a first portion of a fin region of the substrate;
a gate structure over a second portion of the fin region, wherein the epitaxy structure is in contact with a sidewall of the second portion of the fin region;
at least one gate spacer present adjacent to the gate structure, wherein:
the gate spacer comprises a plurality of group VIIIA impurities therein,
the gate spacer comprises a first layer and a second layer over the first layer,
the first layer comprises an oxide,
the second layer comprises a nitride,
the source drain feature comprises a light-doped drain (LDD) region present under the gate spacer,
an upper portion of the LDD region has a dopant concentration higher than a dopant concentration of a bottom portion of the gate spacer,
a lower portion of the LDD region has a dopant concentration lower than the dopant concentration of the bottom portion of the gate spacer; and
a dielectric layer in contact with a portion of the first layer underlying the second layer and in contact with the second layer.

8. The semiconductor device of claim 7, wherein the group VIIIA impurities comprise Xe.

9. The semiconductor device of claim 7, wherein the epitaxy structure is in contact with a sidewall of the LDD region.

10. The semiconductor device of claim 9, wherein a bottom surface of the epitaxy structure is below a bottom surface of the LDD region.

11. The semiconductor device of claim 7, wherein:
the second layer comprises the plurality of group VIIIA impurities therein.

12. The semiconductor device of claim 7, wherein the dopant concentration of the bottom portion of the gate spacer is in a range from about $6 \times 10^{19}$ atoms/cm$^3$ to about $1 \times 10^{20}$ atoms/cm$^3$.

13. A semiconductor device comprising:
a substrate;
at least one source drain feature, wherein the source drain feature comprises:
a light-doped drain (LDD) region; and
an epitaxy structure in contact with a portion of the substrate underlying the LDD region;
a gate structure present on the substrate;
at least one gate spacer present on at least one sidewall of the gate structure, wherein:
at least a bottom portion of the gate spacer has a plurality of dopants therein,
an upper portion of the LDD region has a dopant concentration higher than a dopant concentration of the bottom portion of the gate spacer, and
a lower portion of the LDD region has a dopant concentration lower than the dopant concentration of the bottom portion of the gate spacer; and
a dielectric layer in contact with the bottom portion of the gate spacer having the plurality of dopants therein and in contact with a top surface of the epitaxy structure, wherein:
the gate spacer comprises a first layer and a second layer, and
the dielectric layer is in contact with the first layer and the second layer.

14. The semiconductor device of claim 13, wherein a bottom surface of the epitaxy structure is below a bottom surface of the LDD region.

15. The semiconductor device of claim 13, wherein the second layer is in contact with a sidewall and a top surface of the first layer.

16. The semiconductor device of claim 13, wherein the second layer is spaced apart from the LDD region by a portion of the first layer.

17. The semiconductor device of claim 16, wherein the second layer is in contact with a sidewall of the first layer and a top surface of the portion of the first layer.

18. The semiconductor device of claim 16, wherein the dielectric layer is in contact with the portion of the first layer.

19. The semiconductor device of claim 13, wherein the dopant concentration of the bottom portion of the gate spacer is in a range from about $6 \times 10^{19}$ atoms/cm$^3$ to about $1 \times 10^{20}$ atoms/cm$^3$.

20. The semiconductor device of claim 13, wherein the gate spacer comprises a plurality of group VIIIA impurities.

* * * * *